United States Patent
Lee et al.

(10) Patent No.: US 8,502,448 B2
(45) Date of Patent: Aug. 6, 2013

(54) DISPLAY APPARATUS COMPRISING A COMPOSITE MEMBER OF A RESIN MATRIX AND CARBON FIBERS

(75) Inventors: Jung-Min Lee, Yongin (KR); Kie-Hyun Nam, Yongin (KR); Choong-Ho Lee, Yongin (KR); Dong-Ki Lee, Yongin (KR); Hoon Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 151 days.

(21) Appl. No.: 12/987,623

(22) Filed: Jan. 10, 2011

(65) Prior Publication Data

US 2011/0248907 A1    Oct. 13, 2011

(30) Foreign Application Priority Data

Apr. 13, 2010 (KR) .................. 10-2010-0033903

(51) Int. Cl.
*H01J 1/62*    (2006.01)
*H01J 63/04*    (2006.01)

(52) U.S. Cl.
USPC ........... 313/512; 313/483; 313/500; 313/501; 313/502; 313/503; 313/504; 313/505; 313/506; 313/511

(58) Field of Classification Search
None
See application file for complete search history.

(56) References Cited

U.S. PATENT DOCUMENTS

| | | | | |
|---|---|---|---|---|
| 8,064,033 B2 * | 11/2011 | Saida et al. | ............... | 349/158 |
| 2004/0132867 A1 | 7/2004 | Shibahara et al. | | |
| 2007/0092709 A1 | 4/2007 | Okamoto et al. | | |
| 2008/0143247 A1 | 6/2008 | Kim et al. | | |
| 2009/0268472 A1 | 10/2009 | Kim et al. | | |
| 2010/0013372 A1 * | 1/2010 | Oikawa et al. | ............... | 313/498 |

FOREIGN PATENT DOCUMENTS

| | | |
|---|---|---|
| CN | 201178100 Y | 1/2009 |
| EP | 2037433 A1 | 3/2009 |
| JP | 06325868 | 11/1994 |
| JP | 2001133761 | 5/2001 |
| JP | 2009265611 | 11/2009 |
| JP | 201040522 | 2/2010 |
| KR | 10-2004-0077879 | 9/2004 |
| KR | 10-2007-0045095 | 5/2007 |
| KR | 10-2008-0045824 | 5/2008 |
| KR | 10-2008-0054569 | 6/2008 |
| WO | 9609158 A1 | 3/1996 |

OTHER PUBLICATIONS

Japanese Office action issued by JPO on Sep. 4, 2012 in connection with Japanese Patent Application serial No. 2011-000186 which also claims Korean Patent Application Serial No. 10-2010-0033903 as its priority document and Request for Entry of the Accompanying Office Action attached herewith.

German Office Action dated Dec. 12, 2012 issued by GPTO corresponding to German Patent application No. 102011006832.5 which claims to Korean patent application No. 10-2010-0033903 with Request for the Entry of the Accompanying Office Action.

Chinese Office Action issued on May 6, 2013 by Chinese Patent Office in the examination of the Chinese Patent Application No. 201110058812.8, which corresponds to Korean Patent Application No. 10-2010-0033903 and Request for Entry of the Accompanying Office Action attached herewith.

* cited by examiner

*Primary Examiner* — Natalie Walford
(74) *Attorney, Agent, or Firm* — Robert E. Bushnell, Esq.

(57) ABSTRACT

A display apparatus having an improved function for encapsulating a display unit, and comprising a substrate, wherein the display unit is disposed on the substrate; an encapsulation unit facing the display unit, the encapsulation unit comprising: a metal layer; and a composite member; and a sealing unit disposed between the substrate and the encapsulation unit and separated from the display unit so as to adhere the substrate to the encapsulation unit, wherein the composite member comprises a resin matrix and carbon fibers, and wherein the metal layer is disposed between the substrate and the composite member.

13 Claims, 3 Drawing Sheets

DISPLAY APPARATUS COMPRISING A COMPOSITE MEMBER OF A RESIN MATRIX AND CARBON FIBERS

CROSS-REFERENCE TO RELATED APPLICATIONS

This application claims the benefit of Korean Patent Application No. 10-2010-0033903, filed on Apr. 13, 2010, in the Korean Intellectual Property Office, the disclosure of which is incorporated herein in its entirety by reference.

BACKGROUND

1. Field

Aspects of the present invention relate to a display apparatus, and more particularly, to a display apparatus having an improved function for encapsulating a display unit.

2. Description of the Related Art

Recently, display devices have been replaced with portable thin flat panel display apparatuses. In particular, the thin flat panel display apparatuses including an organic light emitting display apparatus and a liquid crystal display (LCD) apparatus have been highlighted for their excellent image qualities. A flat panel display apparatus has a structure in which a display unit is disposed on a substrate, and an encapsulation unit is disposed on the display unit so as to protect the display unit. Also, a sealing unit is disposed between the substrate and an encapsulation substrate.

The encapsulation unit is easily deformed or damaged due to heat, and is vulnerable to penetration of external moisture or foreign substances. Due to these features, a display unit-encapsulation function of the encapsulation unit deteriorates such that there is a limit to improving display characteristics of a display apparatus.

SUMMARY

Aspects of the present invention provide a display apparatus having an improved function for encapsulating a display unit.

According to aspects of the present invention, there is provided a display apparatus including a substrate; a display unit disposed on the substrate; an encapsulation unit facing the display unit, the encapsulation comprising: a metal layer; and a composite member; and a sealing unit disposed between the substrate and the encapsulation unit and separated from the display unit so as to adhere the substrate to the encapsulation unit, wherein the composite member comprises a resin matrix and carbon fibers, and wherein the metal layer is disposed between the substrate and the composite member.

According to another aspect of the present invention, some of the carbon fibers are arrayed in a direction and others of the carbon fibers are arrayed in another direction crossing the direction.

According to another aspect of the present invention, the carbon fibers may be arrayed in a horizontal direction and a vertical direction and then may be woven.

According to another aspect of the present invention, a thermal expansion rate of the plurality of carbon fibers may be less than a thermal expansion rate of the substrate.

According to another aspect of the present invention, a thickness of the composite member may be larger than a thickness of the metal layer.

According to another aspect of the present invention, the composite member may be formed to have layers, and each of the layers may include a resin matrix and carbon fibers.

According to another aspect of the present invention, the carbon fibers that are disposed in at least one layer from among the layers may be arrayed in a first direction, the carbon fibers that are disposed in another layer from among the layers may be arrayed in a second direction, and the first direction and the second direction are not parallel.

According to another aspect of the present invention, the first direction and the second direction may be orthogonal to each other.

According to another aspect of the present invention, the composite member may include a first layer, a second layer, a third layer, and a fourth layer, wherein each of the first layer, the second layer, the third layer, and the fourth layer may include a resin matrix and carbon fibers, wherein both the second layer and the third layer may be disposed between the first layer and the fourth layer, and the carbon fibers of the second layer and the third layer may be arrayed in a first direction, wherein the carbon fibers of the first layer and the fourth layer may be arrayed in a second direction, and wherein the first direction and the second direction are not parallel.

According to another aspect of the present invention, the first direction and the second direction may be orthogonal to each other.

According to another aspect of the present invention, the sealing unit may include an epoxy resin.

According to another aspect of the present invention, the sealing unit may be formed around the display unit.

According to another aspect of the present invention, the display unit may include an organic light emitting device.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
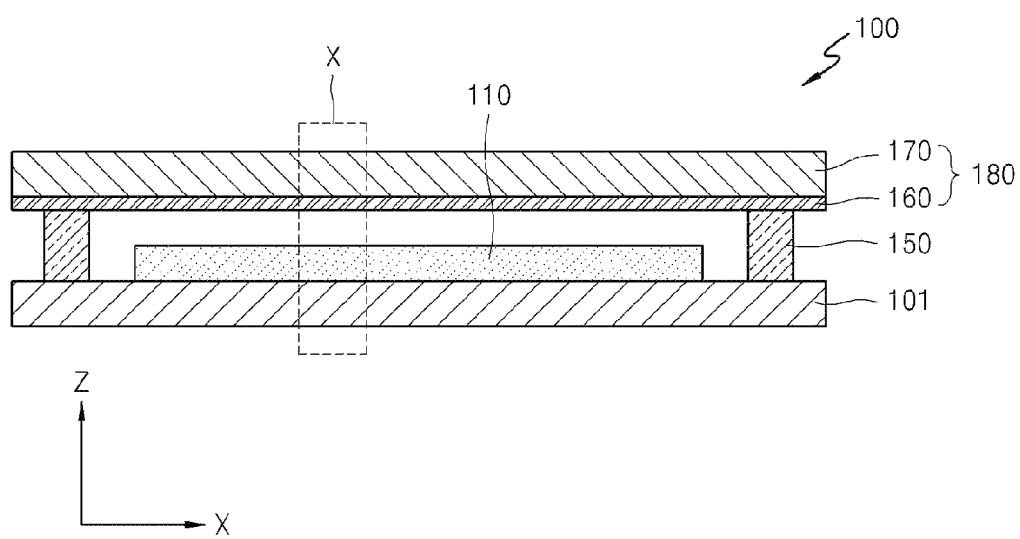
FIG. 1 is a cross-sectional view of a display apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
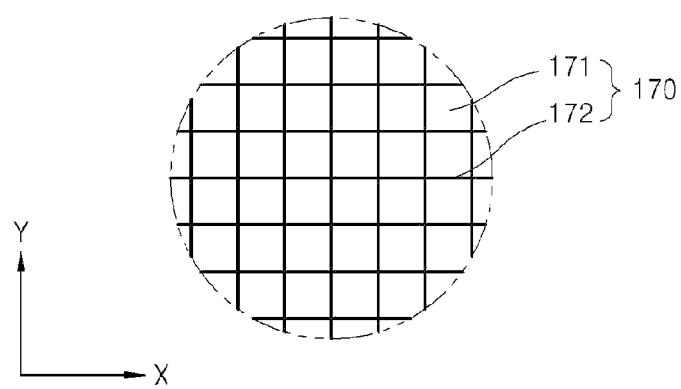
FIG. 2 is a plan view of a magnified portion of an encapsulation unit of the display apparatus of FIG. 1.
Figure 3:
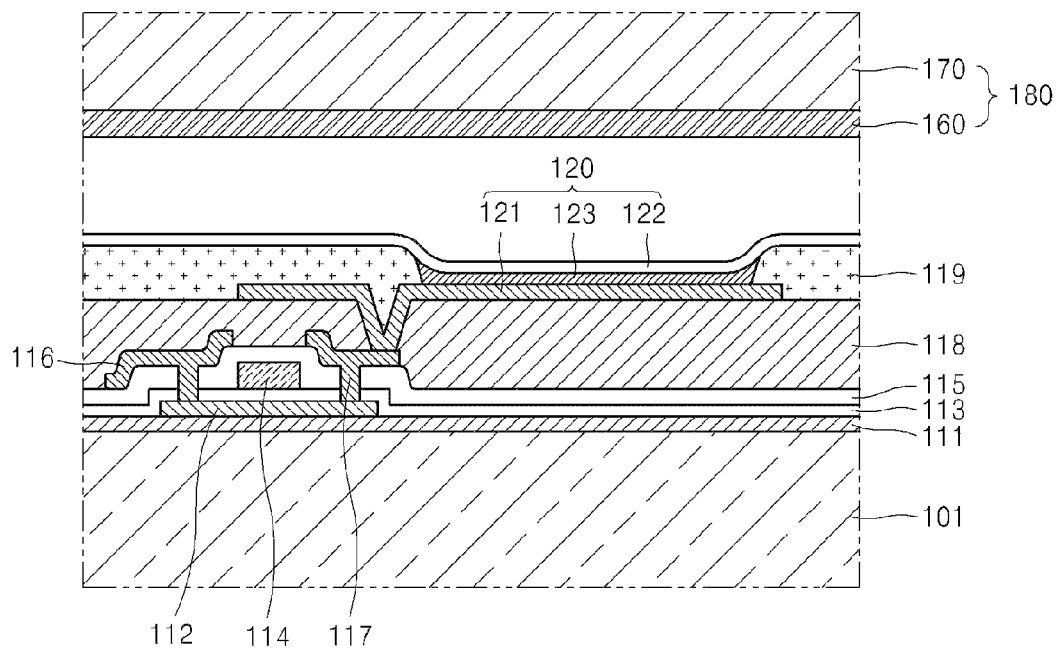
FIG. 3 is a magnified view of a portion X of the display apparatus of FIG. 1.

FIG. 1 is a cross-sectional view of a display apparatus 100 according to an embodiment of the present invention. FIG. 2 is a plan view of a magnified portion of an encapsulation unit 180 of the display apparatus 100 of FIG. 1. FIG. 3 is a magnified view of a portion X of the display apparatus 100 of FIG. 1. Referring to FIG. 1, the display apparatus 100 includes a substrate 101, a display unit 110, the encapsulation unit 180, and a sealing unit 150. The encapsulation unit 180 includes a metal layer 160 and a composite member 170. Hereinafter, the aforementioned members will be described in detail.

The substrate 101 is formed of transparent glass containing $SiO_2$ as a main component. However, aspects of the present invention are not limited thereto, and the substrate 101 may also be formed of a transparent plastic material that may be an insulating organic material selected from the group consisting of polyethersulphone (PES), polyacrylate (PAR), polyetherimide (PEI), polyethyelene napthalate (PEN), polyethylene terephthalate (PET), polyphenylene sulfide (PPS), polyallylate, polyimide, polycarbonate (PC), triacetate cellulose (TAC), and cellulose acetate propionate (CAP), or other suitable materials.

A plurality of processes are performed to form the display unit 110 on the substrate 101, and since heat is applied to the substrate 101 while the plurality of processes are performed, the substrate 101 expands due to the heat. Expansion of the substrate 101 decreases durability of the display apparatus 100 and accuracy of the display unit 110. Thus, the substrate 101 has a low thermal expansion rate, and in more detail, the substrate 101 has a thermal expansion rate of $3\times10^{-6}$/K through $4\times10^{-6}$/K.

The display unit 110 is disposed on the substrate 101. The type of the display unit 110 may vary and may be a liquid crystal display (LCD) device, an organic light emitting display (OLED) device or other suitable display devices. According to aspects of the present embodiment, the display unit 110 includes an organic light emitting device. However, aspects of the present invention are not limited thereto and the display unit 110 may include a liquid crystal device.

The encapsulation unit 180 is disposed to face the display unit 110. The sealing unit 150 is disposed between the substrate 101 and the encapsulation unit 180. The sealing unit 150 is formed around the display unit 110. The sealing unit 150 contacts the substrate 101 and the encapsulation unit 180, and includes a heat-curable resin. In more detail, the sealing unit 150 includes an epoxy resin. However, aspects of the present invention are not limited thereto, and the sealing unit 150 may include other suitable materials. The encapsulation unit 180 protects the display unit 110 from external moisture or oxygen, and includes the metal layer 160 and the composite member 170.

The composite member 170 is formed on the metal layer 160. That is, compared to the metal layer 160, the composite member 170 is disposed apart from the display unit 110. Or in other words, the composite member 170 is disposed on a surface of the metal layer 160 not facing the display unit 110, and the metal layer 160 is closer to the substrate 101 than the composite member 170. The composite member 170 includes a resin matrix 171 and carbon fibers 172.

In more detail, as illustrated in FIG. 2, the composite member 170 is formed by impregnating the carbon fibers 172 with the resin matrix 171. Here, the carbon fibers 172 are disposed to cross each other. Also, the carbon fibers 172 may be formed by weaving weft and warp fibers from among the carbon fibers 172.

The sealing unit 150 is cured by heat so as to adhere the substrate 101 to the encapsulation unit 180. Here, when heat is applied to the sealing unit 150, the encapsulation unit 180 may expand. If the encapsulation unit 180 is significantly expanded by heat, adhesion between the substrate 101 and the encapsulation unit 180 deteriorates such that the durability of the display apparatus 100 may be decreased. However, according to aspects of the present embodiment, the encapsulation unit 180 includes the composite member 170 having a low thermal expansion rate, and thus an expansion degree of the encapsulation unit 180 is not large during a heat application process. In more detail, the composite member 170 has a thermal expansion rate that is less than or similar to a thermal expansion rate of the substrate 101.

The composite member 170 is formed by impregnating the carbon fibers 172 with the resin matrix 171. The carbon fibers 172 have a thermal expansion rate that is less than the thermal expansion rate of the substrate 101. In particular, the thermal expansion rate of the carbon fibers 172 in a longitudinal direction has a negative (−) value. Also, since the plurality of carbon fibers 172 do not absorb moisture, a moisture-proof characteristic of the encapsulation unit 180 is improved.

The resin matrix 171 that is impregnated with the plurality of carbon fibers 172 has a thermal expansion rate of $15\times10^{-6}$/K through $120\times10^{-6}$/K. By mixing the plurality of carbon fibers 172 and the resin matrix 171, it is possible to form the composite member 170 having a desired thermal expansion rate. That is, the composite member 170 is formed to have the thermal expansion rate that is less than or similar to the thermal expansion rate of the substrate 101. Here, the volume of the plurality of carbon fibers 172 and the volume of the resin matrix 171 is adjusted in such a manner that the thermal expansion rate of the composite member 170 is controlled to have a desired value.

When the composite member 170 is formed, the carbon fibers 172 are disposed to cross each other. That is, some of the carbon fibers 172 are disposed in an X-direction of FIG. 2 and some are disposed in a Y-direction of FIG. 2. By doing so, it is possible to form the composite member 170 having a thermal expansion rate that is uniformly low over an entire region. Referring to FIG. 2, the carbon fibers 172 are disposed to orthogonally cross each other. However, aspects of the present invention are not limited thereto, and a crossing angle of the plurality of carbon fibers 172 may be set to allow the composite member 170 to have a desired thermal expansion rate. Also, the carbon fibers 172 disposed in the X-direction of FIG. 2 and the carbon fibers 172 disposed in the Y-direction of FIG. 2 may be woven like a fabric. By doing so, durability of the composite member 170 is improved.

The metal layer 160 has a more dense structure than the composite member 170. By using the metal layer 160 together with the composite member 170, the encapsulation unit 180 may effectively prevent moisture and foreign substances from entering the display unit 110. A thermal expansion rate of the metal layer 160 is larger than the thermal expansion rate of the composite member 170. Also, the thermal expansion rate of the metal layer 160 may be larger than the thermal expansion rate of the substrate 101. However, since the encapsulation unit 180 includes the composite member 170, a thermal expansion rate of the entire encapsulation unit 180 is maintained to be low. In particular, a thickness of the composite member 170 is larger than the metal layer 160 so that the thermal expansion rate of the entire encapsulation unit 180 is effectively maintained to be low.

According to aspects of the present invention, the type of the display unit 110 may be a variety of display devices, and in the present embodiment, the display unit 110 includes an organic light emitting device. The display unit 110 will now be described in detail with reference to FIG. 3. A buffer layer 111 is formed on the substrate 101. The buffer layer 111 provides a flat surface on the substrate 101, and prevents moisture and foreign substances from entering toward the substrate 101.

An active layer 112 having a predetermined pattern is formed on the buffer layer 111. The active layer 112 is formed of an inorganic semiconductor such as amorphous silicon or polysilicon, or formed of an organic semiconductor, and includes a source region, a drain region, and a channel region. The source and drain regions are formed by doping the active layer 112 that is formed of amorphous silicon or polysilicon, with impurities. By being doped with boron (B) that is a group III element, a p-type semiconductor is formed, and by being doped with nitrogen (N) that is a group V element, an n-type semiconductor is formed.

A gate insulating layer 113 is formed on the active layer 112, and a gate electrode 114 is formed on a predetermined region of the gate insulating layer 113. The gate insulating layer 113 functions to insulate the active layer 112 from the gate electrode 114, and is formed of an organic material or an inorganic material including SiNx, $SiO_2$, or other suitable materials. The gate electrode 114 is formed of a metal selected from the group consisting of Au, Ag, Cu, Ni, Pt, Pd, Al, and Mo, or is formed of a metal alloy such as Al—Nd alloy, Mo—W alloy, and the like. However, aspects of the present invention are not limited thereto and the gate electrode 114 may be formed by using various materials in consideration of adhesion, planarization, electrical resistance, formability, or the like. The gate electrode 114 is connected to a gate line (not shown) for applying an electrical signal.

An interlayer insulating layer 115 is formed on the gate electrode 114. The interlayer insulating layer 115 and the gate insulating layer 113 are formed in such a manner that the source and drain regions of the active layer 112 are exposed, and a source electrode 116 and a drain electrode 117 contact the exposed source and drain regions of the active layer 112. The source electrode 116 and the drain electrode 117 are formed of a metal selected from the group consisting of Au, Pd, Pt, Ni, Rh, Ru, Ir and Os, or may be formed of a metal alloy containing at least two metals from the group consisting of Al, Mo, Al—Nd alloy, and Mo—W alloy but is not limited thereto.

A passivation layer 118 is formed to cover the source electrode 116 and the drain electrode 117. For the passivation layer 118, an inorganic insulating layer and/or an organic insulating layer is used. The inorganic insulating layer may include $SiO_2$, SiNx, SiON, $Al_2O_3$, $TiO_2$, $Ta_2O_5$, $HfO_2$, $ZrO_2$, BST, or PZT, and the organic insulating layer may include polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinylalcohol-based polymer, or a combination thereof. The passivation layer 118 is formed as a multi-stack including the inorganic insulating layer and the organic insulating layer. However, aspects of the present invention are not limited thereto, and the passivation layer 118 may be formed in other suitable structures. The passivation layer 118 is formed to expose the drain electrode 117.

An organic light emitting device 120 is formed to be connected to the exposed drain electrode 117. The organic light emitting device 120 includes a first electrode 121, a second electrode 122, and an intermediate layer 123. In more detail, the first electrode 121 and the drain electrode 117 contact each other. The intermediate layer 123 includes an organic light emitting layer, and emits visible light when a voltage is applied thereto via the first electrode 121 and the second electrode 122. A pixel defining layer 119 is formed of an insulating material and is arranged on the first electrode 121.

A predetermined opening is formed on the pixel defining layer 119 so as to expose the first electrode 121. The intermediate layer 123 is formed on the exposed first electrode 121. Afterward, the second electrode 122 is formed to be connected to the intermediate layer 123. The first electrode 121 and the second electrode 122 have polarities of an anode electrode and a cathode electrode, respectively. However, the polarities of the first electrode 121 and the second electrode 122 may be changed around. The encapsulation unit 180 is disposed on the second electrode 122.

The display apparatus 100, according to the present embodiment, includes the encapsulation unit 180. The encapsulation unit 180 includes the composite member 170 and the metal layer 160. The composite member 170 includes the carbon fibers 172 and the resin matrix 171. Thus, the composite member 170 is formed to have the low thermal expansion rate. The metal layer 160 of the encapsulation unit 180 has the thermal expansion rate that is larger than the substrate 101 and the composite member 170. In this manner, since the encapsulation unit 180 includes both the metal layer 160 and the composite member 170 having the low thermal expansion rate, the encapsulation unit 180 is formed to have a desired low thermal expansion rate. In particular, the encapsulation unit 180 has the thermal expansion rate similar to the substrate 101. By doing so, it is easy to manufacture the display apparatus 100 having improved durability in a high temperature process.

Also, durability of the encapsulation unit 180 may be improved in such a manner that the plurality of carbon fibers 172 included in the composite member 170 are arrayed to cross each other or are woven. Thus, an encapsulation characteristic of the encapsulation unit 180 is improved due to the metal layer 160.

Figure 4:
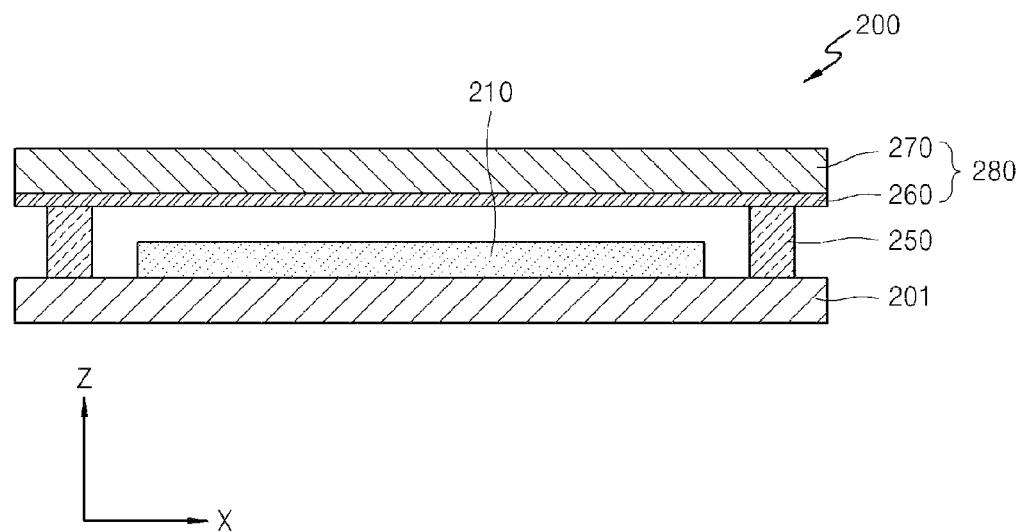
FIG. 4 is a cross-sectional view of a display apparatus according to another embodiment of the present invention.
Figure 5:
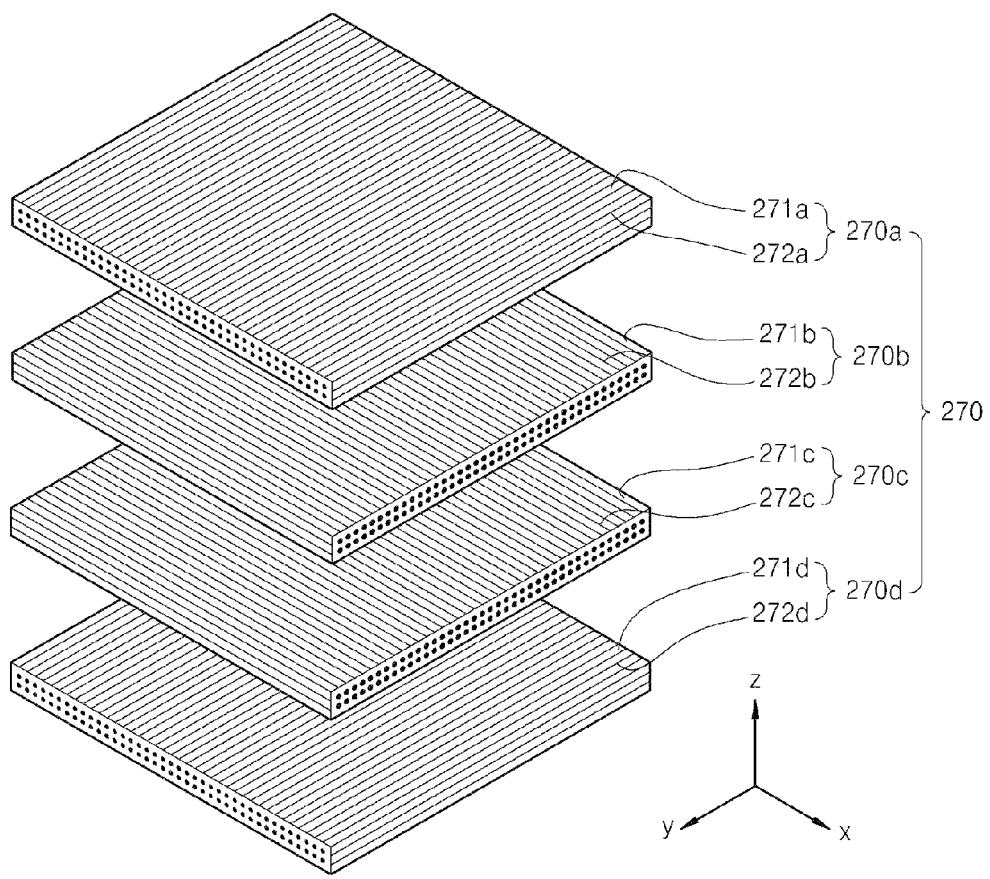
FIG. 5 is an exploded perspective view of a composite member of the display apparatus of FIG. 4.

FIG. 4 is a cross-sectional view of a display apparatus 200 according to another embodiment of the present invention. FIG. 5 is an exploded perspective view of a composite member 270 of the display apparatus 200 of FIG. 4. For convenience of description, only the features of the present embodiment that are different from the previous embodiment will be provided here. Referring to FIGS. 4 and 5, the display apparatus 200 includes a substrate 201, a display unit 210, an encapsulation unit 280, and a sealing unit 250. The encapsulation unit 280 includes a metal layer 260 and the composite member 270.

The display unit 210 is disposed on the substrate 201. According to aspects of the present invention, a type of the display unit 210 may vary. The encapsulation unit 280 is disposed to face the display unit 210. The sealing unit 250 is disposed between the substrate 201 and the encapsulation unit 280. The sealing unit 250 adheres the substrate 201 to the encapsulation unit 280, and includes a heat-curable resin. In more detail, the sealing unit 250 includes an epoxy resin.

The encapsulation unit 280 includes the metal layer 260 and the composite member 270. The composite member 270 includes a plurality of layers. Each of the layers includes a resin matrix and a plurality of carbon fibers, and is formed by impregnating the plurality of carbon fibers with the resin matrix. In more detail, the composite member 270 includes a first layer 270a, a second layer 270b, a third layer 270c, and a fourth layer 270d. The first through fourth layers 270a, 270b, 270c, and 270d each include the resin matrixes 271a, 271b, 271c, and 271d and the carbon fibers 272a, 272b, 272c, and 272d, respectively.

An array direction of the carbon fibers 272a and 272d of the first layer 270a and the fourth layer 270d crosses an array direction of the carbon fibers 272b and 272c of the second layer 270b and the third layer 270c. In more detail, the array direction of the carbon fibers 272a and 272d of the first layer 270a and the fourth layer 270d is a first direction, which is a Y-axis as illustrated in FIG. 5. The array direction of the carbon fibers 272b and 272c of the second layer 270b and the third layer 270c is a second direction, which is an X-axis as illustrated in FIG. 5. The first direction and the second direction are orthogonal to each other. However, aspects of the present invention are not limited thereto. That is, in order to adjust a thermal expansion rate of the composite member 270 to a desired value, it is possible to vary an angle formed between the array direction of the carbon fibers 272a and 272d of the first layer 270a and the fourth layer 270d and the array direction of the carbon fibers 272b and 272c of the second layer 270b and the third layer 270c.

The composite member 270 is formed on the metal layer 260. That is, compared to the metal layer 260, the composite member 270 is disposed away from the display unit 210. In other words, the composite member 270 is disposed on a surface of the metal layer 260 not facing the display unit 210, and the metal layer 260 is closer to the substrate 201 than the composite member 270.

The display apparatus 200, according to the present embodiment, includes the encapsulation unit 280 that has the composite member 270 and the metal layer 260. The composite member 270 includes the layers shown in FIG. 5. Each of the layers includes the resin matrix and the plurality of carbon fibers. Thus, it is possible to form the composite member 270 having the thermal expansion rate that is uniformly low over an entire region. The metal layer 260 of the encapsulation unit 280 has a thermal expansion rate that is larger than the substrate 201 and the composite member 270. In this manner, since the encapsulation unit 280 includes both the metal layer 260 and the composite member 270, the encapsulation unit 280 is formed to have a low thermal expansion rate, and in particular, the encapsulation unit 280 has the thermal expansion rate similar to the substrate 201. Accordingly, it is easy to manufacture the display apparatus 200 having improved durability using a high temperature process.

Also, each layer of the composite member 270 is formed to have the plurality of carbon fibers arrayed in a single direction, and then is stacked onto another layer. By doing so, it is possible to form the composite member 270 having the plurality of carbon fibers that are arrayed to cross each other.

According to aspects of the present invention, the display apparatus may have an improved function of encapsulating the display unit.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A display apparatus comprising:
a substrate;
a display unit disposed on the substrate;
an encapsulation unit facing the display unit, the encapsulation unit comprising:
a metal layer; and
a composite member; and
a sealing unit disposed between the substrate and the encapsulation unit and separated from the display unit so as to adhere the substrate to the encapsulation unit,
the composite member comprising a resin matrix and carbon fibers, and
the metal layer being disposed between the substrate and the composite member.

2. The display apparatus of claim 1, some of the carbon fibers being arrayed in a first direction and others of the carbon fibers being arrayed in another direction crossing the first direction.

3. The display apparatus of claim 1, the carbon fibers being arrayed in a horizontal direction and a vertical direction and then being woven.

4. The display apparatus of claim 1, a thermal expansion rate of the plurality of carbon fibers being less than a thermal expansion rate of the substrate.

5. The display apparatus of claim 1, a thickness of the composite member being larger than a thickness of the metal layer.

6. The display apparatus of claim 1, the composite member being formed to have layers,
each of the layers comprising:
a resin matrix; and
carbon fibers.

7. The display apparatus of claim 6, the carbon fibers that are disposed in at least one layer from among the layers being arrayed in a first direction,
the carbon fibers that are disposed in another layer from among the layers being arrayed in a second direction, and
the first direction and the second direction not being parallel.

8. The display apparatus of claim 7, the first direction and the second direction being orthogonal to each other.

9. The display apparatus of claim 1, the composite member comprising:
a first layer;
a second layer;
a third layer; and
a fourth layer,
each of the first layer, the second layer, the third layer, and the fourth layer comprising:
a resin matrix; and
carbon fibers,
both the second layer and the third layer being disposed between the first layer and the fourth layer,
the carbon fibers of the second layer and the third layer being arrayed in a first direction,
the carbon fibers of the first layer and the fourth layer being arrayed in a second direction, and
the first direction and the second direction not being parallel.

10. The display apparatus of claim 9, the first direction and the second direction being orthogonal to each other.

11. The display apparatus of claim 1, the sealing unit comprising an epoxy resin.

12. The display apparatus of claim 1, the sealing unit being formed around the display unit.

13. The display apparatus of claim 1, the display unit comprising an organic light emitting device.

* * * * *